United States Patent [19]

Bockett-Pugh et al.

[11] 4,441,074
[45] Apr. 3, 1984

[54] APPARATUS FOR SIGNATURE AND/OR DIRECT ANALYSIS OF DIGITAL SIGNALS USED IN TESTING DIGITAL ELECTRONIC CIRCUITS

[75] Inventors: Charles P. Bockett-Pugh, Bracknell; Brian L. Kett, Poole, both of England

[73] Assignee: The Solartron Electronic Group Limited, Farnborough, England

[21] Appl. No.: 238,384

[22] Filed: Feb. 24, 1981

[30] Foreign Application Priority Data

Feb. 28, 1980 [GB] United Kingdom ................. 8006829

[51] Int. Cl.$^3$ ..................... G01R 31/28; G01R 15/12; G06F 11/00
[52] U.S. Cl. .................................... 324/73 R; 371/25
[58] Field of Search ..................... 324/73 R, 73 AT; 371/24–26, 15

[56] References Cited

U.S. PATENT DOCUMENTS 3,961,252 6/1976 Eichelberger ................. 324/73 AT
4,176,780 12/1979 Sacher et al. .
4,192,451 3/1980 Swerling et al. ............. 324/73 R X
4,280,220 7/1981 Vaeches ........................ 324/73 R X

FOREIGN PATENT DOCUMENTS 1464515 2/1977 United Kingdom .

Primary Examiner—Gerard R. Strecker
Attorney, Agent, or Firm—Dale Gaudier

[57] ABSTRACT

A digital circuit tester for performing signature analysis is provided with a memory (32) for storing successive samples at 256-bit intervals of the progressively evolving CRC signature of a signal in the circuit under test. Comparison with the same sequence from a known good unit facilitates identification of faults, even in feedback loops. To identify the first failing bit, the test is repeated, but with the CRC feedback connections disabled, and successive blocks of the actual data stream are stored, beginning at the point corresponding to the first faulty signature sample, for subsequent inspection and comparison with the data stream from the known good unit.

5 Claims, 1 Drawing Figure

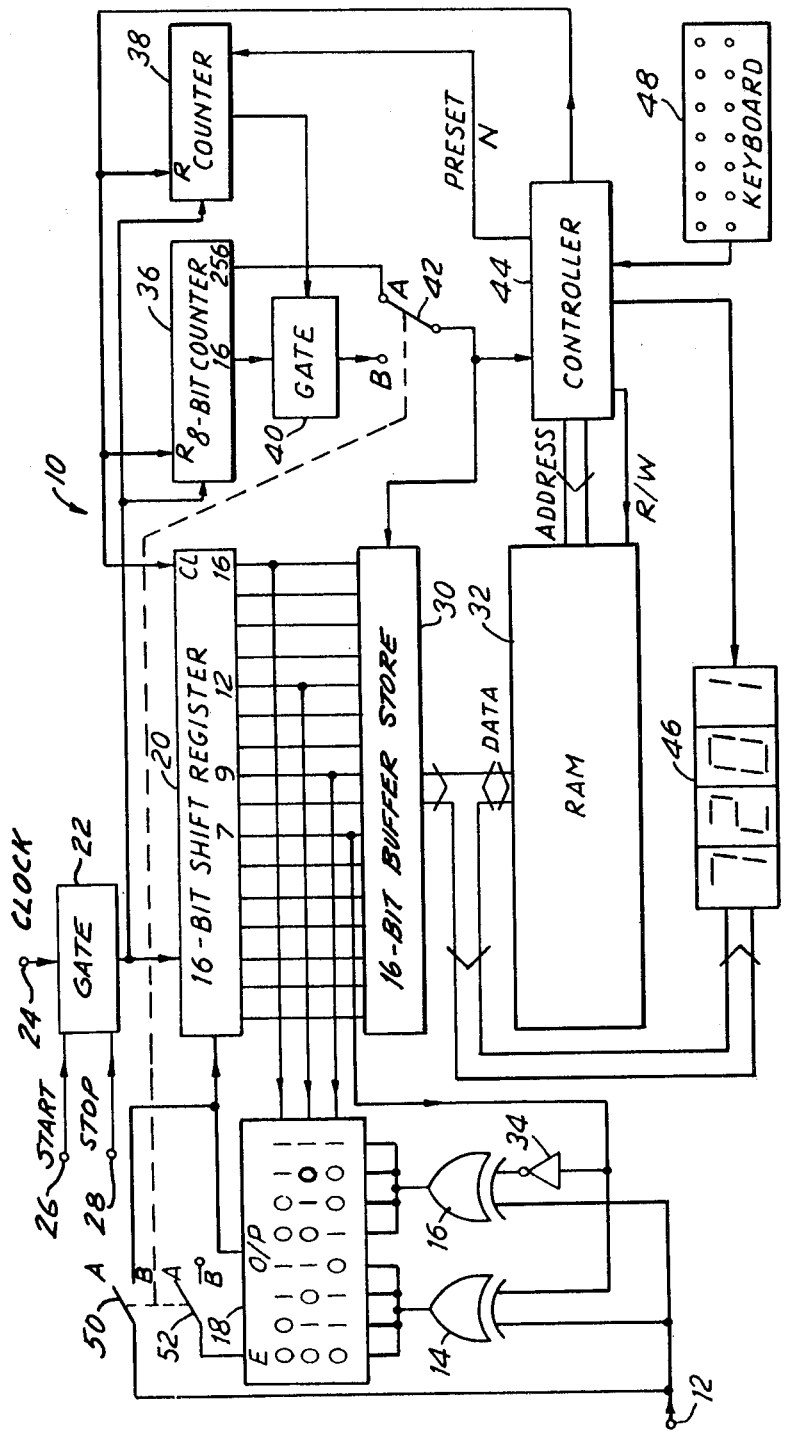

APPARATUS FOR SIGNATURE AND/OR DIRECT ANALYSIS OF DIGITAL SIGNALS USED IN TESTING DIGITAL ELECTRONIC CIRCUITS

This invention relates to apparatus for testing digital electronic circuits.

BACKGROUND OF THE INVENTION

Various methods and apparatus for testing digital electronic circuits have been adopted, including oscilloscopes, event counters, transition counters and logic analysers. More recently, and as described in U.S. Pat. No. 3,976,864, a technique known as signature analysis has been proposed, in which a data stream from a point in a circuit to be tested is applied to the input of, for example, a shift register having feedback connections between various of its stages and its input. Consequently, at the end of the data stream, the shift register contains a short multi-bit word which is unique to the sequence of binary digits constituting that particular one of the very large number of possible long data streams. Comparison of this word or signature obtained from the circuit under test with that obtained from the same or another circuit known to be properly functioning enables a malfunction in the circuit under test to be detected and identified.

A problem which has been encountered with the technique described in the above mentioned patent specification is that it is of limited utility in the testing of circuits including feedback paths, since a faulty bit stream arising from a malfunction in the feedback loop will propagate continuously around the loop thereby disguising the origin of the fault. Previous methods of avoiding this problem have required the provision of switches in the circuit under test to enable feedback loops therein to be temporarily opened before the test is conducted. This places additional constraints on the design of the circuit under test, and is also obviously inapplicable to the testing of existing circuits not including such switches.

SUMMARY OF THE INVENTION

According to one aspect of this invention there is provided apparatus for testing a digital electronic circuit comprising:

input means arranged to receive a digital signal from a selected location in the digital electronic circuit;

means arranged to deliver a series of clock pulses, each pulse being coincident with a bit of the digital signal;

signature generation means connected to the input means and the clock pulse means and arranged in a first operative mode to generate successive signature words from the digital signal by combining each of a selected plurality of bits of the digital signal with preselected other ones of the selected plurality of bits of the digital signal, and in a second operative mode to receive said digital signal without combining preselected bits thereof;

counter means connected to the clock pulse means and arranged to generate a trigger signal each time a predetermined number of clock pulses have been delivered by said clock pulse means;

storage means connected to the signature generation means and the counter means and arranged to respond to a plurality of said trigger signals to store the corresponding contents of the signature generation means; and additional counter means connected to said clock pulse means and said storage means and arranged to inhibit said storage means from responding to said trigger signals in said second operative mode until a preselected number of clock pulses has been delivered by said clock pulse means.

With this apparatus signatures representing successively longer portions of a data stream can be examined and compared with a corresponding set of signatures derived from the same or a similar circuit known to be properly functioning. The first signature in the set derived from the circuit under test which is different from the set derived from a known good unit is indicative of the approximate time of occurrence within the data stream of the fault condition. This information generally enables the cause of the fault to be deduced, irrespective of the presence of any feedback loop in the circuit under test and the possible subsequent propagation of the faulty bit stream around the loop.

To identify the cause of the fault more precisely, the test is repeated, but this time the data stream itself is stored as successive portions (for example 16 bits in length) starting at approximately the time of occurrence in the data stream of the fault condition. Subsequently, each portion of the data stream can be examined to determine the time of occurrence of the first faulty bit in the data stream.

BRIEF DESCRIPTION OF THE DRAWING FIGURE

A method and apparatus for testing a digital electronic circuit in accordance with this invention will now be described, by way of example, with reference to the accompanying drawing, which shows a block schematic diagram of the apparatus.

DESCRIPTION OF THE PREFERRED EMBODIMENT

Referring to the drawing, the apparatus indicated generally at 10 has an input terminal 12 to receive a data stream from a selected location in a digital circuit to be tested. This input terminal 12 is connected to one input of each of two 2-input exclusive-OR gates 14 and 16, the outputs of which are connected to various respective inputs of a 3-to-8 line data selector 18. In particular, the exclusive-OR gate 14 is connected to those inputs of the data selector 18 for which the 3 bit code has even parity, and the exclusive-OR gate 16 is connected to those inputs for which the 3 bit code has odd parity. The output of the data selector 18 is coupled to the input of a 16-bit shift register 20. The shift input terminal of the shift register 20 is coupled via a gate 22 to a clock input terminal 24 which is intended to be coupled to a source of clock pulses in the circuit under test and having the same bit rate as the data stream at the input terminal 12. These clock pulses are passed by the gate 22 in accordance with signals applied to start and stop terminals 26 and 28 respectively.

The 16 stages of the shift register 20 are coupled in parallel to a 16-bit buffer store 30, which is in turn coupled to the 16-bit data bus of a random access memory 32. Selected ones of the stages of the shift register 20, in this case the stages 9, 12 and 16, are also connected to the 3 control inputs of the data selector 18. In addition, stage 7 of the shift register 20 is coupled directly to the exlusive-OR gate 14 and via an inverter 34 to the exclusive-OR gate 16.

The clock pulses delivered by the gate 22 to the shift register 20 are also delivered to an 8 bit counter 36 and a second counter 38. The 8 bit counter 36 has two outputs, one indicative of a count of 16 and the other of a count of 256. The count 16 output is coupled via a gate 40 to a terminal B of a changeover switch 42, and the count 256 output is directly coupled to a terminal A of the switch 42. The counter 38 is arranged to count up to a preset number N, whereupon it supplies an output signal opening the gate 40.

The common terminal of the switch 42 is coupled to a latch input of the buffer store 30, and also to an input of a controller 44. This controller 44 is also coupled to the address bus and read/write inputs of the RAM 32, to the clear input of the shift register 20 and the reset inputs of the counters 36 and 38, and to an enable input of a four digit 7 segment display 46, which is in turn coupled to the 16 bit data bus of the RAM 32.

The operation of the apparatus shown in the drawing as regards the principle of generation of signature words is similar to that of the apparatus described in the above mentioned patent specification, and therefore need only be summarised here. When a start signal (which may be supplied for example manually, or in response to the occurrence of a predetermined signal or pattern of signals in the circuit under test) is applied to the start terminal of the gate 22, clock pulses are delivered thereby to the clock input of the shift register 20. Thereupon, the bit signals comprising the data stream applied to the input of the shift register 20 via the exclusive-OR gate 14 or the exclusive-OR gate 16 and the data selector 18, are shifted into the shift register 20. The bit signals in the data stream applied to the input 12 are selectively inverted before being applied to the input of the shift register 20 in accordance with the pattern of bits already present in the shift register 20, by means of the feedback connections from the stages 7, 9, 12 and 16 of the shift register 20 to the exclusive-OR gates 14 and 16 and the data selector 18. In particular, when the bits in stages 9, 12 and 16 have even parity, the output of the exclusive-OR gate 14 is connected to the input of the shift register 20, whereas when these bits have odd parity, the output of the exclusive-OR gate 16 is connected to the input of the shift register 20. The exclusive-OR gate 14 will invert the data stream applied to the input terminal 12 when the bit in stage 7 is a 1, whereas the exclusive-OR gate 16 will invert the data stream when the bit in stage 7 is a 0.

The net result is that the bits in the stages 7, 9, 12 and 16, together with the bit currently present at the input terminal 12 and the bit currently present at the input terminal of the shift register 20, always have even parity. In consequence, the shift register 20 operates as described in the aforementioned patent specification to implement a cyclic redundancy check algorithm and compress the data stream into a 16 bit long signature. A new signature is generated for each successive bit applied to the input terminal 12, until a stop signal (which may be manually applied, or supplied in response to the occurrence of a predetermind signal or pattern of signals in the circuit under test, or generated after a predetermined number of clock pulses have been delivered by the gate 22 to the shift register 20) is applied to the stop terminal 28 of the gate 22.

It should be noted that the novel parity generator constituted by the exclusive-OR gates 14 and 16, the data selector 18 and the inverter 34 permits faster operation of the apparatus 10 (typically by a factor of 2) as compared with apparatus incorporating the conventional type of parity generator constituted by several cascaded exclusive-OR gates.

For operation of the shift register 20 to generate signatures as described above, the switch 42 is in its position A, as shown in the drawing. Consequently, every time that the 8 bit counter 36 counts 256 clock pulses delivered by the gate 22, it supplies a trigger signal from its count 256 output via the switch 42 to the buffer store 30 and the controller 44. This trigger signal causes the buffer store 30 to latch the 16 bit signature word then present in the shift register 20. The trigger pulse also causes the controller 44 subsequently to address a respective location in the RAM 32, at the same time energising the read/write input of the RAM 32 to write the signature word latched in the buffer store 30 into that location of the RAM 32. The controller 44 is arranged to address the first location in the RAM 32 after the first 256 clock pulses delivered by the gate 22, and to address successive locations in the RAM 32 for each subsequent 256 bits. This process continues either until a stop signal is applied to the stop terminal 28 of the gate 22, or until all the locations in the RAM 32 are full. When the process has been completed, the controller 44 clears the shift register 20 and re-sets the counters 36 and 38, in readiness for another test sequence.

At the end of a test sequence, the RAM 32 contains a series (typically up to 128) of 16 bit signature words characteristic of successively longer portions of the data stream applied to the input terminal 12. Thus, the signature word in the first location in the RAM 32 is characteristic of the first 256 bits of the data stream, the signature word in the second location is characteristic of the first 512 bits of the data stream, the signature word in the third location is characteristic of the first 768 bits, etc.

The controller 44 is arranged to interrogate any selected location in the RAM 32, for example under the control of a keyboard indicated at 48, thereby causing the contents of that selected location to be put on the data bus of the RAM 32, and at the same time the controller 44 energises the display 46, so that the 16 bit signature word stored in the selected location is indicated in the form of 4 hexadecimal digits by the display 46. In particular, the successive signature words stored in the RAM 32 can be scanned and compared with a set of signature words previously generated by the apparatus 10 shown in the drawing from a data stream obtained from the same point in the same circuit, or another one equivalent to it, and known to be functioning correctly. Any difference between the set of signature words generated during the test sequence and the previously generated set of signature words is indicative of the existence of a fault condition in the the circuit under test, and the position of the first differing signature word in the set generated during the test sequence is indicative of the time of first occurrence in the data stream of the fault condition. Thus, for example, if the first differing signature word is that stored in the 6th location in the RAM 32, the time of first occurrence of the fault condition must lie between the 1280th and 1536th bits of the data stream.

Depending on the nature of the circuit under test, and the extent of the diagnostic information available for fault finding, this information may be sufficient to enable the fault to be identified, perhaps with the aid of other items of test equipment.

However, in certain circumstances it may be desirable to identify the precise time of occurrence of the first erroneous bit in the data sequence. To this end, the apparatus 10 includes 2 normally open switches 50 and 52 coupled to operate simultaneously with the switch 42. The switch 50 is connected between the input terminal 12 and the data input of the shift register 20, while the switch 52 is coupled between an enable input of the data selector 18 and a voltage source chosen such that when the switch 52 is closed the data selector 18 is disabled. Thus, when the switches 42, 50 and 52 are moved from their position A to their position B, three changes occur: the buffer store 30 and the controller 44 now receive their trigger signals from the count 16 output of the counter 36, via the gate 40 controlled by the counter 38; the data selector 18 is disabled, thereby preventing signals from the exclusive-OR gates 14 and 16 from reaching the data input of the shift register 20; and the input terminal 12 becomes directly connected to the data input of the shift register 20. Thus, the shift register 20 can now receive the data stream without modification, and the feedback tappings from its stages 7, 9, 12 and 16 become ineffective, so that the shift register 20 merely acts as a conventional 16 bit delay line.

As previously noted, the counter 38 can be preset to a chosen number N, for example by the controller 44 under the control of the keyboard 48. The number N is chosen to be equal to the position in the data stream of the first bit of the block of 256 bits corresponding to the first faulty signature word generated during the test sequence. Thus, in the example mentioned above, where the 6th word stored in the RAM 32 was faulty, N would be set equal to 1281.

The test sequence is now repeated, for the same test point in the circuit under test, and for the same set of start and stop conditions. For the first 1280 bits of the data stream appearing at the input terminal 12, the circuitry is inactive, except for the shift register 20, and the counter 38 which is counting down from 1281 in response to clock pulses delivered by the gate 22. However, when the counter 38 reaches a count of 0, it opens the gate 40, thereby permitting trigger signals from the count 16 output of the counter 36 to reach the buffer store 30 and the controller 44. Thereafter, for every 16th bit in the data stream, the buffer store 30 is triggered by the 8 bit counter 36 to latch the 16 bits currently present in the shift register 20, whereafter the controller 44 energises the read/write input of the RAM 32 to store those 16 bits in a respective location signalled by the controller 44 on the address bus of the RAM 32. As for the first test sequence, this process continues either until a stop signal is applied to the stop terminal 28 of the gate 22, or until the RAM 32 is full. At the end of the second test sequence, the RAM contains in its successive locations successive blocks of 16 bits each from the data stream, starting with the first bit of the block of 256 bits corresponding to the first faulty signature word. These 16 bit blocks can now be examined in turn, in the same manner as for the signature words derived during the first test sequence, under the control of the keyboard 48 and the controller 44, and compared with a known good sequence of 16 bit blocks, thereby enabling the first erroneous block and thus the first erroneous bit to be identified.

If desired, a second RAM may be provided, so that the test sequence can be performed first on the circuit under test and then on an equivalent circuit known to be functioning correctly. Furthermore, the controller 44 can be arranged to compare automatically the two sequences of signature words thus obtained and determine if any of those derived from the circuit under test are erroneous. If they are, the switches 42, 50 and 52 can be moved to their position B, and the collection of data from the circuit under test and the known good unit repeated, whereafter the controller 44 compares automatically the two sequences of 16 bit data blocks thus obtained, and indicates the first erroneous bit in the data stream derived from the circuit under test.

The apparatus shown in the drawing can also be used in conjunction with computer-controlled automatic test equipment (ATE), in which case the display 46 may be omitted, the inspection and comparison of the data words stored in the RAM 32 being effected by the ATE computer.

We claim:

1. Apparatus for testing a digital electronic circuit comprising:

input means for receiving a digital signal from a selected location in the digital electronic circuit;

means for delivering a series of clock pulses, each pulse being coincident with a bit of the digital signal;

switch means for selecting first or second operative modes of the apparatus;

signature generation means connected to the input means to receive said digital signal therefrom and to the clock pulse means to receive said clock pulses to synchronise operation of the signature generation means with said digital signal, and having combining means responsively coupled to said switch means, said combining means being enabled in said first operative mode for combining each of a selected plurality of bits of the digital signal with preselected other ones of the selected plurality of bits of the digital signal, whereby said signature generation means generates successive signature words from the digital signal in said first operative mode, and said combining means being disabled in said second operative mode, whereby said signature generation means receives and temporarily stores said digital signal unchanged in said second operative mode;

counter means connected to the clock pulse means for generating a trigger signal each time a predetermined number of clock pulses has been delivered by said clock pulse means;

storage means connected to the signature generation means and the counter means for responding to a plurality of said trigger signals to store the corresponding contents of the signature generation means; and additional counter means connected to said clock pulse means and said storage means and responsively coupled to said switch means for inhibiting said storage means from responding to said trigger signals in said second operative mode until a preselected number of clock pulses has been delivered by said clock pulse means;

whereby, in said first operative mode, said apparatus generates and stores successive signature words from said digital signal to permit approximate time of occurrence of any fault in said signal to be determined, and, in said second operative mode, said apparatus stores successive sections of said digital signal starting at the time of fault occurrence determined in said first operative mode, to permit the signal to be analysed.

2. Apparatus according to claim 1, wherein said counter means is responsively coupled to said switch means to change said predetermined number to a lower value in said second operative mode.

3. Apparatus according to claim 1, wherein said signature generation means includes a shift register which is used in both said first and second operative modes.

4. Apparatus according to claim 1, wherein said storage means comprises buffer register means connected to said signature generation means and said counter means to receive the contents of the signature generation means for each trigger signal, and random access memory means connected to said buffer register means to receive and store said contents.

5. Apparatus according to claim 1, wherein said signature generation means comprises shift register means connected to said clock pulse means and having an input and a multiplicity of stages, and said combining means comprises first and second exclusive OR-gates connected to said input means to receive said digital signal and connected to said shift register means to receive respectively a signal and the inverse thereof from a preselected one of said stages, and selector means connected to said exclusive OR-gates and said sift register means and arranged selectively to couple one of said exclusive OR-gates to said input of said shift register means in accordance with the parity of bits in preselected other ones of said stages.

* * * * *